(12) United States Patent
Moon

(10) Patent No.: US 10,134,787 B2
(45) Date of Patent: Nov. 20, 2018

(54) PHOTOGRAPHING APPARATUS FOR PREVENTING LIGHT LEAKAGE AND IMAGE SENSOR THEREOF

(71) Applicant: SAMSUNG ELECTRONICS CO., LTD., Suwon-si, Gyeonggi-do (KR)

(72) Inventor: Jae-joon Moon, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 24 days.

(21) Appl. No.: 15/013,191

(22) Filed: Feb. 2, 2016

(65) Prior Publication Data

US 2016/0373634 A1 Dec. 22, 2016

(30) Foreign Application Priority Data

Jun. 19, 2015 (KR) .................. 10-2015-0087582

(51) Int. Cl.
*H04N 5/353* (2011.01)
*H04N 5/369* (2011.01)
(Continued)

(52) U.S. Cl.
CPC .. *H01L 27/14603* (2013.01); *H01L 27/14609* (2013.01); *H01L 27/14621* (2013.01);
(Continued)

(58) Field of Classification Search
CPC ......... H01L 27/14603; H01L 27/14627; H01L 27/14623; H01L 27/14621;
(Continued)

(56) References Cited

U.S. PATENT DOCUMENTS

2011/0019038 A1 1/2011 Okuno
2011/0298949 A1 12/2011 Lee et al.
(Continued)

FOREIGN PATENT DOCUMENTS

JP 2014-146023 8/2014
JP 2015-012059 1/2015
(Continued)

OTHER PUBLICATIONS

Search Report and Written Opinion dated May 31, 2016 in counterpart International Patent Application No. PCT/KR2016/001070.
(Continued)

*Primary Examiner* — Hung H Lam
(74) *Attorney, Agent, or Firm* — Nixon & Vanderhye P.C.

(57) ABSTRACT

A photographing apparatus for preventing or reducing light leakage and an image sensor thereof are provided. The photographing apparatus includes an image sensor configured to include a plurality of pixels respectively having a Photo Diode and a Storage Diode for temporarily storing a charge accumulated in the Photo Diode and an image processor configured to perform an image processing operation by receiving the charge stored in the Storage Diode of each of the plurality of pixels. In addition, the image sensor has a structure where the Storage Diodes of the plurality of pixels are arrayed to be adjacent to each other. Accordingly, the photographing apparatus may prevent the light leakage from the adjacent pixel being flowed into a Storage Diode of each pixel.

19 Claims, 15 Drawing Sheets

(51) Int. Cl.
*H01L 27/146* (2006.01)
*H04N 5/359* (2011.01)
*H04N 5/3745* (2011.01)
*H04N 9/04* (2006.01)

(52) U.S. Cl.
CPC .. H01L 27/14623 (2013.01); H01L 27/14627 (2013.01); H04N 5/353 (2013.01); H04N 5/359 (2013.01); H04N 5/3696 (2013.01); H04N 5/37452 (2013.01); H04N 9/045 (2013.01); *H04N 2209/045* (2013.01)

(58) Field of Classification Search
CPC .............. H01L 27/14609; H04N 9/045; H04N 5/37452; H04N 5/3696; H04N 5/359; H04N 5/353; H04N 2209/045
See application file for complete search history.

(56) References Cited

U.S. PATENT DOCUMENTS

| | | | |
|---|---|---|---|
| 2013/0070131 A1* | 3/2013 | Ohkubo | H01L 27/14623 348/294 |
| 2013/0093911 A1 | 4/2013 | Sul et al. | |
| 2014/0077283 A1 | 3/2014 | Lenchenkov | |
| 2014/0085517 A1* | 3/2014 | Lenchenkov | H01L 27/14629 348/294 |
| 2014/0166858 A1 | 6/2014 | Lee | |
| 2014/0197301 A1* | 7/2014 | Velichko | H01L 27/14625 250/208.1 |
| 2014/0246568 A1 | 9/2014 | Wan | |
| 2015/0060951 A1 | 3/2015 | Hynecek | |
| 2015/0162368 A1 | 6/2015 | Egawa | |
| 2015/0163427 A1 | 6/2015 | Rotte et al. | |
| 2015/0215558 A1 | 7/2015 | Kishi | |
| 2015/0255498 A1* | 9/2015 | Sugiura | H01L 27/14621 257/432 |
| 2015/0256769 A1* | 9/2015 | Kim | H01L 27/14607 348/302 |
| 2016/0211306 A1* | 7/2016 | Choi | H01L 27/14638 |

FOREIGN PATENT DOCUMENTS

| | | |
|---|---|---|
| KR | 10-2014-0078092 | 6/2014 |
| WO | WO 2014/208060 | 12/2014 |

OTHER PUBLICATIONS

Extended European Search Report for EP Application No. 16811784.4 dated May 23, 2018.

* cited by examiner

TWO PD STRUCTURE

FOUR PD STRUCTURE

PHOTOGRAPHING APPARATUS FOR PREVENTING LIGHT LEAKAGE AND IMAGE SENSOR THEREOF

CROSS-REFERENCE TO RELATED APPLICATIONS

This application is related to and claims priority under 35 U.S.C. § 119 to Korean Patent Application No. 10-2015-0087582, filed on Jun. 19, 2015, in the Korean Intellectual Property Office, the disclosure of which is incorporated by reference herein in its entirety.

BACKGROUND

1. Field

The disclosure generally relates to a photographing apparatus for preventing and/or reducing light leakage and an image sensor thereof, and for example, to a photographing apparatus for preventing and/or reducing light leakage which occurs in a global shutter and an image sensor thereof.

2. Description of Related Art

In general, an image sensor which generates an image by electrically converting incident light admitted into a lens of a photographing apparatus may be roughly classified into a Charge-Coupled Device (CCD) type image sensor and a Complementary Metal-Oxide Semiconductor (CMOS) type image sensor.

Both of the image sensors maintain proper exposure through an operation of a shutter for controlling light amount based on initiation/terminating of light exposure. The shutter for controlling the light amount is classified into a rolling shutter and a global shutter according to an operating mode.

A rolling shutter type refers to a method of sequentially initiating/terminating the light exposure for respective pixels since an image sensor does not include a storage for storing a charge of a Photo Diode of each pixel. A global shutter type refers to a method of simultaneously initiating the light exposure in entire pixels of an image sensor and simultaneously terminating the light exposure in the entire pixels by using a storage of each pixel after the proper exposure time elapses.

However, in an image sensor of a CMOS-type global shutter, light leakage occurs when the global shutter operates. The light leakage refers to a state where light leaks towards adjacent pixels related to a high-brightness subject area while the charges stored in the entire pixels are stored in a Storage Diode of each pixel at once in a batch or lump, and the charges stored in the Storage Diode of each pixel is read out. Specifically, in case of a pixel which performs a readout operation last, light leakage occurs more significantly in a Storage Diode of the pixel in proportion to a time of performing the readout operation.

Furthermore, a leakage charge caused by the light leakage due to diffraction and diffused reflection of the incident light admitted into a Photo Diode of each pixel may flow into the Storage Diode of each pixel of the image sensor of the CMOS-type global shutter, and a leakage charge caused by the light leakage due to diffraction and diffused reflection of the incident light admitted into a Photo Diode of an adjacent pixel may additionally flow into the Storage Diode of each pixel of the image sensor of the CMOS-type global shutter.

SUMMARY

The disclosure addresses the aforementioned and other problems and disadvantages occurring in the related art, and an aspect of the disclosure provides a global shutter-type photographing apparatus and an image sensor thereof for preventing and/or reducing the light leakage that light flows into Storage Diodes of respective pixels of the image sensor by adjacent pixels.

According to an example, a photographing apparatus is provided, including: an image sensor configured to include a plurality of pixels, each pixel respectively having a Photo Diode and a Storage Diode, said Storage Diode temporarily storing a charge accumulated in the Photo Diode; and an image processor configured to perform an image processing operation by receiving the charge stored in the Storage Diode of each of the plurality of pixels. In addition, the image sensor has a structure where the Storage Diodes of the plurality of pixels are arrayed to be adjacent to each other.

The image sensor may have a structure where a Storage Diode of each pixel in an odd column and a Storage Diode of each pixel in an even column among the plurality of pixels are arrayed to be adjacent to each other.

The image sensor may have a structure where a shading curtain is formed in an area in which the Storage Diodes of the plurality of pixels are arrayed to be adjacent to each other.

The image sensor may have a structure where a micro lens is arrayed in an area in which the Photo Diode of each of the plurality of pixels is arrayed and the area in which the Storage Diodes of the plurality of pixels are arrayed to be adjacent to each other.

The image sensor may have a structure where a micro lens is arrayed in the area in which the Photo Diode of each of the plurality of pixels is arrayed.

The image sensor may have a structure where a micro lens is arrayed in each of the plurality of pixels.

A Storage Diode of a first pixel and a Storage Diode of a second pixel among the plurality of pixels may be adjacent to each other, and a shading curtain may be formed in an area in which the Storage Diode of the first pixel and the Storage Diode of the second pixel are adjacent. In addition, the image sensor may perform a phase difference auto focusing operation based on an amount of the charge respectively accumulated in the Photo Diodes of the first pixel and the second pixel of which Storage Diodes are adjacent to each other.

The image sensor may have a multi Photo Diode structure where a micro lens is arrayed in an area in which Photo Diodes of at least two pixels among the plurality of pixels are adjacent to each other.

The image sensor may have a multi Photo Diode structure where a micro lens is arrayed in an area in which Photo Diodes of at least four pixels among the plurality of pixels are adjacent to each other.

The apparatus may further include a controller configured to control the image sensor to read out the charge stored in each of the plurality of pixels. In addition, each of the plurality of pixels may further include Floating Diffusion portion configured to read out the charge stored in the Storage Diode based on a control command of the controller, a first switch configured to perform a switching operation for temporarily storing the charge accumulated in the Photo Diode into the Storage Diode, and a second switch configured to perform a switching operation for reading out the charge being temporarily stored in the Storage Diode by the Floating Diffusion portion.

According to an example, an image sensor is provided, comprising a plurality of pixels, each pixel having a Photo Diode and a Storage Diode, the image sensor including: a structure where Storage Diodes of two adjacent pixels among the plurality of pixels are arrayed to be adjacent to each other.

Pixels in an odd column among the plurality of pixels may be arrayed in an order of a Photo Diode and a Storage Diode, and pixels in an even column among the plurality of pixels may be arrayed in an order of a Storage Diode and a Photo Diode.

Each of the plurality of pixels may have a structure where a shading curtain is formed in an area in which the Storage Diode of each of the plurality of pixels is arrayed to be adjacent to another Storage Diode.

Each of the plurality of pixels may have a structure where a micro lens is formed in an area in which the Photo Diode of each of the plurality of pixels is arrayed and the area in which the Storage Diodes of the plurality of pixels are adjacent to each other.

Each of the plurality of pixels may have a structure where a micro lens is formed in the area in which the Photo Diode of each of the plurality of pixels is arrayed.

Each of the plurality of pixels may have a structure where a micro lens is formed in an area in which the plurality of pixels is formed.

A first pixel and a second pixel being adjacent to each other may have a structure where a shading curtain is formed in an area in which a Storage Diode of the first pixel and a Storage Diode of the second pixel are adjacent. In addition, the image sensor may perform a phase difference auto focusing operation based on an amount of the charge respectively accumulated in the Photo Diodes of the first pixel and the second pixel of which Storage Diodes are adjacent to each other among the plurality of pixels.

Each of the plurality of pixels may have a structure where a micro lens is formed in an area in which Photo Diodes of at least two pixels among the plurality of pixels are adjacent to each other.

Each of the plurality of pixels may have a structure where a micro lens is formed in an area in which Photo Diodes of at least four pixels among the plurality of pixels are adjacent to each other.

According to the above-described various examples, a photographing apparatus may have a structure where the Storage Diodes of respective pixels of the image sensor are arrayed to be symmetrical to each other, thereby preventing and/or reducing light leakage of an adjacent pixel from flowing into the Storage Diodes of respective pixels.

Furthermore, as the photographing apparatus has the structure described in the above examples, light collection efficiency of the Photo Diodes of respective pixels of the image sensor may be improved.

In addition, as the photographing apparatus has the structure described in the above examples, a manufacturing process for forming a micro lens in an area where the Photo Diodes of respective pixels of the image sensor are formed may be performed more easily.

In addition, as the photographing apparatus has the structure described in the above examples, a manufacturing process for forming a shielding curtain for preventing charge occurrence due to the incident light admitted into an area other than the Photo Diodes of respective pixels of the image sensor may be performed more effectively.

In addition, as the photographing apparatus has the structure described in the above examples, a phase difference auto focusing operation may be performed without forming a shielding curtain, and a performance deterioration problem in low illuminance based on the phase difference auto focusing operation may be improved.

In addition, as the photographing apparatus has the structure described in the above examples, an image sensor in a multi Photo Diode structure providing good light collection efficiency may be realized.

BRIEF DESCRIPTION OF THE DRAWINGS

The above and/or other aspects of the disclosure will be more apparent from the detailed description, taken in conjunction with the accompanying drawings, in which like reference numerals refer to like elements, and wherein.

DETAILED DESCRIPTION

Figure 1:
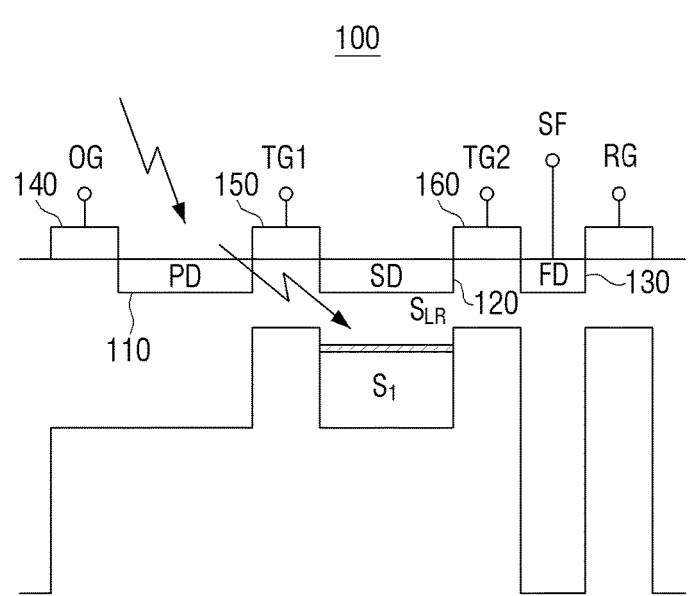
FIG. 1 is a diagram illustrating an example image sensor of a common global shutter.

Certain examples are described in greater detail below with reference to the accompanying drawings.

In the following description, like drawing reference numerals are used for the like elements, even in different drawings. The matters defined in the description, such as detailed construction and elements, are provided to assist in a comprehensive understanding of the examples. However, examples can be practiced without those specifically defined matters. Also, well-known functions or constructions are not described in detail since they may obscure the application with unnecessary detail.

The terms "first", "second", etc. may be used to describe diverse components, but the components are not limited by the terms. The terms are only used to distinguish one component from the others.

The terms used in the disclosure are only used to describe the examples, but are not intended to limit the scope of the disclosure. The singular expression also includes the plural meaning as long as it does not differently mean in the context. In the disclosure, the terms "include" and "comprising" designate the presence of features, numbers, steps, operations, components, elements, or a combination thereof that are written in the specification, but do not exclude the presence or possibility of addition of one or more other features, numbers, steps, operations, components, elements, or a combination thereof.

In the examples of the disclosure, a "module" or a "unit" performs at least one function or operation, and may be implemented with hardware (e.g., circuitry), software, or a combination of hardware and software. In addition, a plurality of "modules" or a plurality of "units" may be integrated into at least one module except for a "module" or a "unit" which has to be implemented with specific hardware, and may be implemented with at least one processor (not shown).

FIG. 1 is a diagram illustrating an example image sensor of a common global shutter.

As illustrated in FIG. 1, an image sensor 100 of a global shutter includes a plurality of pixels generally, each of the plurality of pixels includes a Photo Diode (PD) 110, a Storage Diode (SD) 120, and a Floating Diffusion 130.

In response to the light exposure being initiated in the PD 110 of each pixel by a reset operation of an Over Flow Gate 140, the PD 110 of each pixel converts and accumulates incident light into a charge. Subsequently, in response to a switch of a first Timing Gate 150 being turned on, the charges accumulated in the PD 110 of each pixel are stored in the SD 120 of each pixel together in a batch or lump. In response to a switch of a second Timing Gate 160 being turned on based on a Readout Timing, the Floating Diffusion 130 of each pixel reads out the charges stored in the SD 120 of each pixel sequentially.

Figure 2:
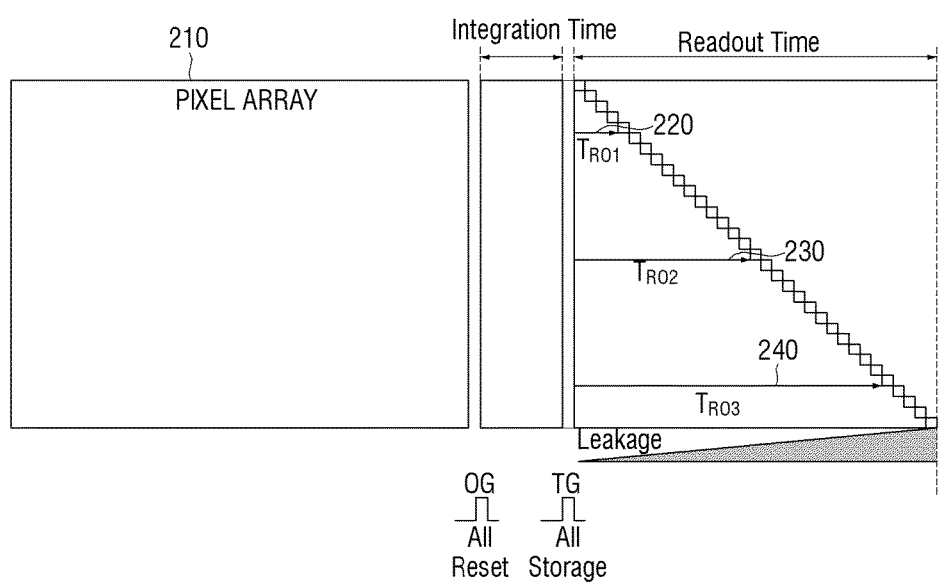
FIG. 2 is a diagram illustrating an example operation of reading out a charge in an image sensor of a global shutter.

FIG. 2 is a diagram illustrating an example operation of reading out a charge in an image sensor of a global shutter.

As illustrated in FIG. 2, the Floating Diffusion 130 for each pixel reads out the charges stored in the SD 120 sequentially on a line basis of a pixel array 210.

The Floating Diffusion 130 of a first line reads out the charges stored in the SD 120, and in response to all of the charges stored in the SD 120 of each pixel of the first line being read out, the Floating Diffusion 130 of a second line reads out the charges stored in the SD 120 of the second line.

As the Floating Diffusion 130 reads out the charges stored in the SD 120 in the above described order, the Floating Diffusion 130 of an n line may read out the charges stored in the SD 120 of each pixel of the n line after all of the charges stored in the SD 130 of each pixel of n−1 line.

Meanwhile, the charge (S1) accumulated in the PD 110 may be flowed into the SD 120 of each pixel, and leakage charge (SLR) caused by the light leakage due to the diffraction and diffused reflection of the incident light admitted into the PD 110 may be additionally flowed into the SD 120 of each pixel.

As illustrated in FIG. 2, the Floating Diffusion 130 in a fifth line among the plurality of pixels arrayed in the pixel array 210 performs a read-out operation after T1 ($T_{RO1}$) time 220 elapses based on a read-out time of the Floating Diffusion 130 in the first line. Accordingly, the charge transmitted from the PD 110 and the SLR during the T1 time 220 are stored in the SD 120 in the fifth line, and thus, the Floating Diffusion 130 reads out a charge value including the SLR being flowed into the SD 120 during the T1 time 220.

The Floating Diffusion 130 in a sixteenth line performs the read-out operation after T2 ($T_{RO2}$) time 230 elapses based on the read-out time of the Floating Diffusion 130 in the first line. Accordingly, the charge transmitted from the PD 110 and the SLR during the T2 time are stored in the SD 120 in the sixteenth line, and thus, the Floating Diffusion 130 reads out the charge value including the SLR being flowed into the SD 120 during the T2 time 230.

The Floating Diffusion 130 in a twenty-eighth line performs the read-out operation after T3 ($T_{RO3}$) time 240 elapses based on the read-out time of the Floating Diffusion 130 in the first line. Accordingly, the charge transmitted from the PD 110 and the SLR during the T3 time are stored in the SD 120 in the twenty-eighth line, and thus, the Floating Diffusion 130 reads out the charge value including the SLR being flowed into the SD 120 during the T3 time 240.

As described above, the amount of SLR being flowed into the SD 120 of each pixel increases in proportion to the read-out time. Accordingly, in case of photographing a white image in the same illuminance, gradation occurs between an upper part and a lower part of the image due to a difference of the SLR that is proportional to the time of reading out the charges stored in the SD 120 of each pixel.

Figure 3:
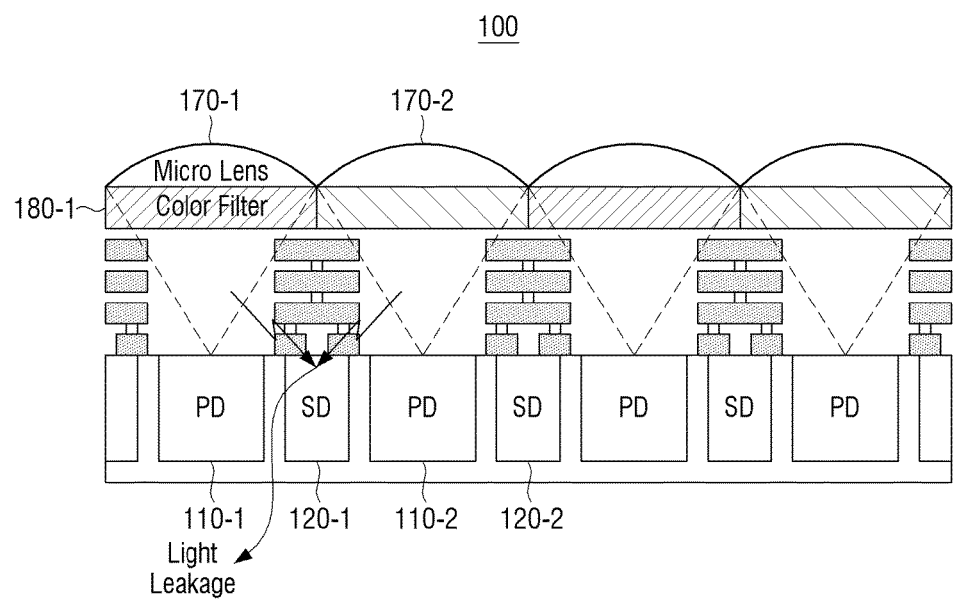
FIG. 3 is a sectional view illustrating an example image sensor of a common global shutter.
Figure 4:
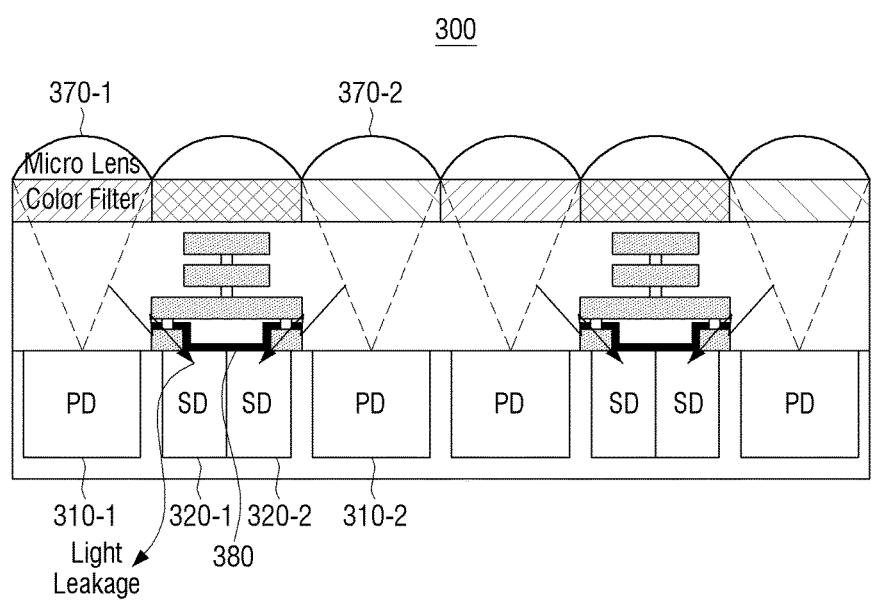
FIG. 4 is a sectional view illustrating an example image sensor of a global shutter.

FIG. 3 is a sectional view illustrating an example image sensor of a common global shutter, and FIG. 4 is a sectional view illustrating an example image sensor of a global shutter.

As described above, the SLR caused by the light leakage due to the diffraction and diffused reflection of the incident light admitted into the PD 110 of each pixel may be flowed into the SD 120 of each pixel, as well as the S1 accumulated in the PD 110.

Meanwhile, as illustrated in FIG. 3, the PD 110 which converts and accumulates the incident light into the charge and the SD 120 which stores the charge accumulated in the PD 110 together in a batch or lump may be arrayed alternately in each of the plurality of pixels of the image sensor 100 of the global shutter.

Accordingly, the SLR caused by the light leakage due to the diffraction and diffused reflection of the incident light admitted into the PD 110 of the adjacent pixel may be flowed into the SD 120 of each pixel additionally, as well as the SLR caused by the light leakage due to the diffraction and diffused reflection of the incident light admitted into the PD 110 of each pixel.

To be specific, the SLR caused by the light leakage due to the diffraction and diffused reflection of the incident light admitted into a first PD 110-1 through a first micro lens 170-1 may be flowed into a first SD 120-1 of the first pixel among the plurality of pixels. In addition, the SLR caused by the light leakage due to the diffraction and diffused reflection of the incident light admitted into a second PD 110-2 through a second micro lens 170-2 of a second pixel being adjacent to the first pixel may be additionally flowed into the first SD 120-1 of the first pixel among the plurality of pixels.

Meanwhile, referring to FIG. 4, a SD 320 of each of the plurality of pixels of the image sensor 300 of the global shutter of the example embodiment is arrayed to be symmetrical to another SD 320, thereby preventing and/or reducing inflow of the SLR caused by the light leakage due to the diffraction and diffused reflection of the incident light admitted into a PD 310 of an adjacent pixel.

For example, as illustrated in FIG. 4, the first pixel among the plurality of pixels of the image sensor 300 of the global shutter may be arrayed in the order of a first PD 310-1 and a first SD 320-1, and the second pixel adjacent to the first pixel may be arrayed in the order of a second SD 320-2 and a second PD 310-2.

The first SD 320-1 of the first pixel and the second SD 320-2 of the second pixel may be arrayed to be symmetrical to each other. Accordingly, the SLR caused by the light leakage due to the diffraction and diffused reflection of the incident light admitted into the second PD 310-2 through a second micro lens 370-2 of the second pixel is flowed into only the second SD 320-2. Only the SLR caused by the light leakage due to the diffraction and diffused reflection of the incident light admitted into the first PD 310-1 through the first micro lens 370-1 is flowed into the first SD 320-1 of the first pixel. Accordingly, the image sensor 300 of the global shutter according to the example embodiment may minimize and/or reduce the amount of SLR flowed into the SD 320 of each pixel as compared with the image sensor 100 in the related art.

Hereinafter, components of the photographing apparatus 10 will be described.

Figure 5:
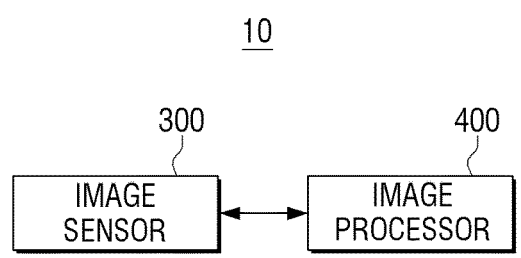
FIG. 5 is a schematic block diagram illustrating an example photographing apparatus.

FIG. 5 is a schematic block diagram illustrating an photographing apparatus.

As illustrated in FIG. 5, the photographing apparatus 10 includes the image sensor 300 and an image processor 400.

The image sensor 300 includes a plurality of pixels, and each of the plurality of pixels may be arrayed on a pixel array. The image sensor 300 including the plurality of pixels is a global shutter-type image sensor which converts the incident light admitted through the micro lens 370 into an electronic signal and accumulates a charge converted into the electronic signal. The image sensor may be the CCD type image sensor or the CMOS type image sensor.

The image processor 400 receives the accumulated charge from the image sensor 300 and generates a photographed image by performing an image processing operation with respect to the image. For example, in response to the charge accumulated in the image sensor 300 in connection with an image being read out, the read charge may be amplified into an analog signal in a proper size through Automatic Gain Control (AGC/not shown) and converted into a digital signal through Analog-to-Digital Converter (ADC/not shown). Accordingly, the image processor 400 may receive the digital signal regarding the read charge through the image sensor 300 in connection with the image, perform the image processing operation including correction and compositeness, and generate an image signal regarding a photographed image.

Figure 6:
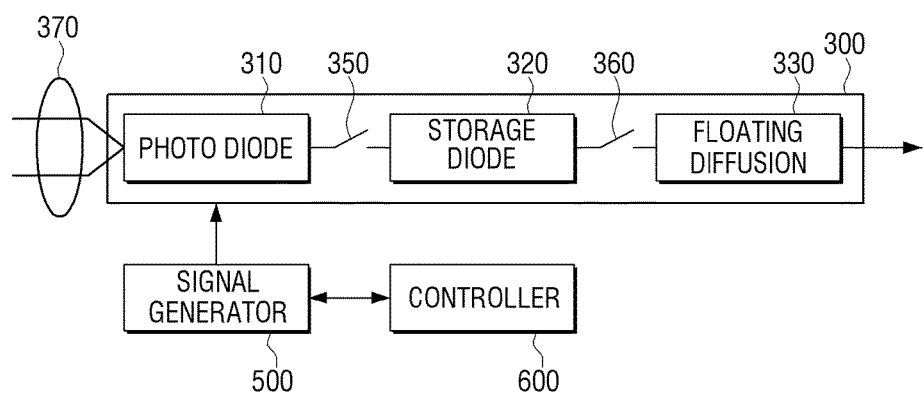
FIG. 6 is a block diagram illustrating an example image sensor.

FIG. 6 is a block diagram illustrating an example image sensor.

As illustrated in FIG. 6, the image sensor 300 is the global shutter-type image sensor and may be a CCD type image sensor or a CMOS type image sensor.

The image sensor 300 includes a plurality of pixels, and each of the plurality of pixels includes a PD 310, a SD 320, and a Floating Diffusion 330. In addition, each of the plurality of pixels of the image sensor 300 may further include a first switch 350 and a second switch 360 for switching transmission and transmission cutoff with respect to the SD 320 and the Floating Diffusion 330 in connection of the charge stored in each of the plurality of pixels.

The PD 310 of each of the plurality of pixels receives the incident light admitted through the micro lens 370, converts the received incident light into an electronic signal, and accumulates the charge converted into the electronic signal. In addition, the SD 320 of each of the plurality of pixels stores the charges stored in the PD 310 of each pixel in a batch or lump.

For example, in response to a photographing command with respect to an image being received while the charges are accumulated in the PD 310 of each pixel, a controller 600 is configured to control a signal generator 500 to generate a batch storing signal. The detailed description on the controller 600 will be provided below. According to a control command of the controller 600, the signal generator 500 generate the batch storing signal and applies the generated batch storing signal to the image sensor 300. Accordingly, in response to the first switch 350 of each pixel being turned on, the PD 310 of each pixel transmits the charges accumulated in the PD 310 of each pixel to the SD 320 in a batch or lump. Accordingly, the charges accumulated in the PD 310 of each pixel are stored in the SD 320 of each pixel in a batch or lump.

As described above, in response to the charges being stored in the SD 320 of each pixel and the second switch 360 being turned on according to a Readout Timing, the Floating Diffusion 330 of each pixel reads out the charges stored in the SD 320 of each pixel sequentially.

Accordingly, the image processor 400 may be configured to receive a digital signal regarding the read charges through the Floating Diffusion 330, perform the image processing operation including correction and compositeness, and generate an image signal regarding a photographed image.

Figure 7:
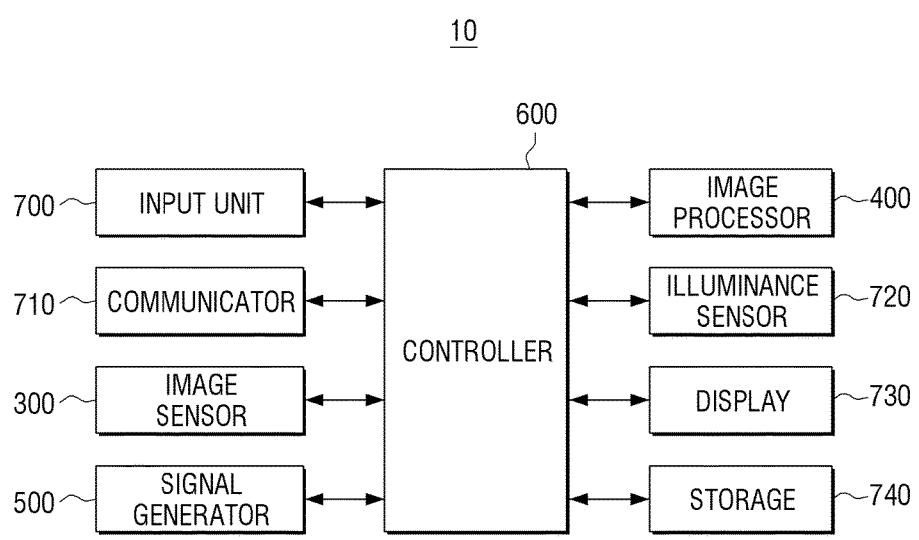
FIG. 7 is a block diagram illustrating an example photographing apparatus.

FIG. 7 is a=block diagram illustrating an example photographing apparatus.

As illustrated in FIG. 7, the photographing apparatus 10 may further include the signal generator 500, the controller 600, an input unit 700 including input circuitry, a communicator 710 including communication circuitry, an illuminance sensor 720, a display 730, and a storage 740, in addition to the image sensor 300 and the image processor 400 described above.

The controller 600 is configured to control overall operations of the components of the photographing apparatus 10. For example, the controller 600 is configured to control the signal processor 500 to apply a reset signal and a batch transmission signal to the image sensor 300. In response to a control command of the controller 600, the signal generator 500 generates the reset signal and the batch transmission signal and applies the signals to the image sensor 300. In response to the reset signal and the batch transmission signal applied by the signal generator 500, the image sensor 300 may apply the charges accumulated in the PD 310 of each pixel to the SD 320 or read out the charges stored in the SD 320 through the Floating Diffusion 330.

The input unit 700 receives a command and may include at least one button (not shown). In addition, the input unit 700 may include a touch panel (not shown) located on the display 730. A detailed description of the display 730 will be provided below. Accordingly, the input unit 700 may receive a command, such as, a photographing command, an editing command with respect to a photographed image, etc., from a user through at least one of the button (not shown) or the touch panel (not shown).

The communicator 710 includes communication circuitry configured to perform data communication with an external terminal device in a wired and/or wireless manner. In case of the wireless data communication, the communicator 710 may include at least one of a Wireless-Fidelity (Wi-Fi) Direct communication module, a Bluetooth module, an Infrared Data Association (IrDA) communication module, a Near Field Communication (NFC) module, a Zigbee module, a cellular communication module, a 3rd Generation (3G) mobile communication module, a 4th Generation (4G) mobile communication module, and a 4G Long Term Evolution (LTE) communication module.

In case of the wired data communication, the communicator 710 may include an interface module such as a Universal Serial Bus (USB). In this case, the communicator 710 may be physically connected to an external terminal device, such as, a Personal Computer (PC), through the interface module to transmit/receive image data or firmware data for performing a firmware upgrade operation.

The illuminance sensor 720 measures illuminance of a subject to be photographed and outputs a value of the measured illuminance to the image processor 400. Accordingly, the image processor 400 is configured to determine a brightness value corresponding to brightness of the subject based on the measured illuminance value received from the illuminance sensor 720. Subsequently, the image processor 400 may be configured to perform an image processing operation, such as, correction, compositeness, etc., based on the determined brightness value and a digital signal regarding the charges being read out through the image sensor 300.

The display 730 displays at least one of an image being processed and generated in the image processor 400 and On-Screen Display (OSD) information based on a control command of the controller 600. For example, the image may be at least one of a photographed image or a live image. The display 730 may be realized as a single body with a touch panel (not shown) for receiving a user touch command.

The storage 740 stores information necessary for controlling a photographed image and the photographing apparatus 10. The storage 740 may be realized as a recording medium such as a volatile memory (for example, a flash memory or an Electrically Erasable Read-Only Memory (EEROM)), a hard disk, etc.

As described above with reference to FIG. 4, the image sensor 300 may have a structure where the SD 320 of each pixel in an odd column among the plurality of pixels and the SD 320 of each pixel in an even column among the plurality of pixels are arrayed to be adjacent to be each other.

For example, as illustrated in FIG. 4, each pixel in the odd column among the plurality of pixels of the image sensor 300 may be arrayed in the order of the PD 310 and the SD 320, and each pixel in the even column among the plurality of pixels of the image sensor 300 may be arrayed in the order of the SD 320 and the PD 310. For example, a first pixel in the odd column among the plurality of pixels of the image sensor 300 may be arrayed in the order of the PD 310 and the SD 320, and a second pixel, being adjacent to the first pixel, in the even column, among the plurality of pixels of the image sensor 300 may be arrayed in the order of the SD 320 and the PD 310. That is, the SD 320 of the first pixel and the SD 320 of the second pixel may be arrayed to be symmetrical to each other.

According to an additional aspect of the example embodiment, the image sensor 300 may have a structure where a shielding curtain 380 is formed in an area where the SD 320 of each of the plurality of pixels is arrayed to be adjacent to the SD 320 of other pixel. For example, the shielding curtain 380 may be a film for preventing and/or reducing a charge due to the incident light admitted into other area than an area of the PD 310, and as illustrated in FIG. 4, the shielding curtain 380 may be formed in an area where the PD 310 of each of the plurality of pixels is arrayed to be adjacent to the PD 310 of other pixel.

In the image sensor 100 of the related art, each of the plurality of pixels is arrayed in the order of the PD 110 and the SD 120. Accordingly, the image sensor 100 in the related art has a structure where a shielding curtain is formed in every area where the SD 120 of each of the plurality of pixels is formed.

The image sensor 300 according to the example embodiment has a structure where the SD 320 of each of the plurality of pixels is adjacent to the SD 320 of other pixel, and the shielding curtain 380 is formed in the area where the SD 320 of each of the plurality of pixels is adjacent to the SD 320 of other pixel. Accordingly, according to the example embodiment, the shielding curtain 380 may be formed more easily as compared with the related art.

According to an additional aspect of the example embodiment, the image sensor 300 may have a structure where a micro lens 370 is formed in an area where the PD 310 of each of the plurality of pixels is arrayed and the area where the SD 320 of each of the plurality of pixels is adjacent to the SD 320 of other pixel.

According to an additional aspect of the example embodiment, the image sensor 300 may have a structure where the micro lens 370 is formed in the area where the PD 310 of each of the plurality of pixels is arrayed.

As described above, the image sensor 300 according to an example embodiment has a structure where the micro lens 370 is formed in the area where the PD 310 of each of the plurality of pixels is arrayed and the area where the SD 320 of each of the plurality of pixels is adjacent to the SD 320 of other pixel or the micro lens 370 is formed only in the area where the PD 310 of each of the plurality of pixels is arrayed, and thus, the light collection efficiency on the PD 310 may be improved as compared with the related art.

According to an additional aspect of the example embodiment, the image sensor 300 may perform a phase difference auto focusing operation based on the structure where the micro lens 370 is arrayed on each of the plurality of pixels. For example, the SD 320 of the first pixel and the SD 320 of the second pixel are adjacent to each other, and the shielding curtain 380 may be formed in the area where the adjacent SDs 320 are formed. Accordingly, the image sensor 300 may perform the phase difference auto focusing operation based on the amount of charge respectively being accumulated in the PD 310 of each of the first pixel and the second pixel which are adjacent to each other.

As described above, the image sensor 300 according to the example embodiment uses the adjacent SD 320 as the shielding curtain for the phase difference auto focusing operation, and thus, the design for the phase difference auto focusing operation may be simplified, and the performance deterioration problem in low illuminance according to the phase difference auto focusing operation in the related art may be improved.

According to an additional aspect of the example embodiment, the image sensor 300 may have a structure where single micro lens 370 is arrayed on the PD 310 of each of the plurality of pixels. According to an example embodiment, the image sensor 300 may have the structure where the micro lens 370 is arrayed in the area where the PD 310 of each of at least two pixels among the plurality of pixels is adjacent to each other.

According to another example embodiment, the image sensor 300 may have the structure where the micro lens 370 is arrayed in the area where the PD 310 of each of at least four pixels among the plurality of pixels is adjacent to each other.

Accordingly, the image sensor 300 according to the example embodiment may have a multi Photo Diode structure where the micro lens 370 is arrayed in the area where the PD 310 of each of the plurality of pixels is adjacent to each other, and for example, the multi Photo Diode structure may provide superior light collection efficiency to the multi Photo Diode structure in the related art.

Figure 8:
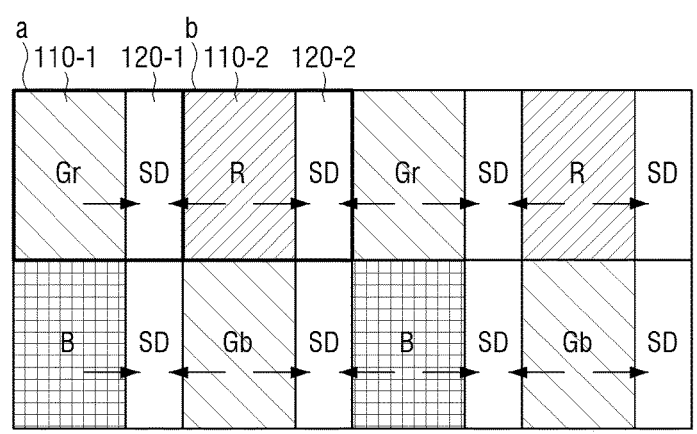
FIG. 8 is a diagram illustrating an example image sensor of a common global shutter.
Figure 9:
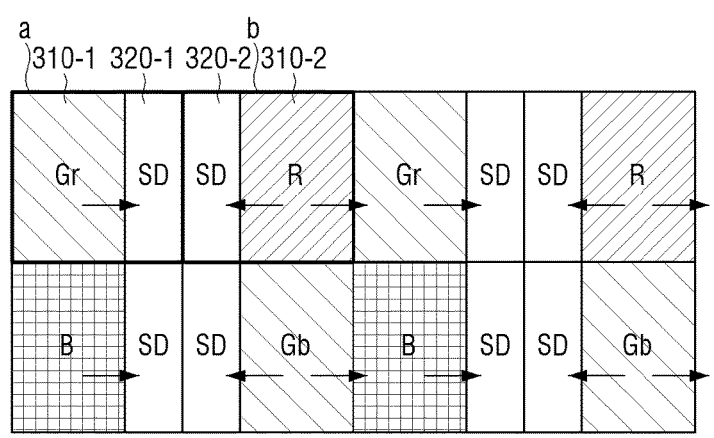
FIG. 9 is a diagram illustrating an example image sensor of a global shutter.

FIG. 8 is a diagram illustrating an example image sensor of a common global shutter, and FIG. 9 is a diagram illustrating an example image sensor of a global shutter according to an example.

In each of the plurality of pixels of the image sensor 100 of the global shutter in the related art, the PD 110 which converts and accumulates the incident light into a charge and the SD 120 which stores the charge stored in the PD 110 in a batch or lump may be arrayed alternately.

For example, as illustrated in FIG. 8, a first pixel (a) among the plurality of pixels of the image sensor 100 in the related art is arrayed in the order of a first PD 110-1 and a first SD 120-1, and a second pixel (b) adjacent to the first pixel (a) is arrayed in the order of a first PD 110-2 and a first SD 120-2.

Accordingly, the SLR caused by the light leakage due to the diffraction and diffused reflection of the incident light admitted into each of the first PD 110-1 of the first pixel (a) and the second PD 110-2 of the second pixel (b) adjacent to the first pixel (a) may be additionally flowed into the first SD 120-1 of the first pixel (a).

Meanwhile, the SD 320 of each of the plurality of pixels of the image sensor 300 of the global shutter according to the example embodiment may be arrayed to be symmetrical to each other.

For example, as illustrated in FIG. 9, the first pixel (a) among the plurality of pixels of the image sensor 300 of the global shutter according to the example embodiment may be arrayed in the order of a first PD 310-1 and a first SD 320-1, and the second pixel (b) adjacent to the first pixel (a) may be arrayed in the order of a second SD 320-1 and a second PD 320-2.

The first SD 320-1 of the first pixel (a) and the second SD 320-2 of the second pixel (b) adjacent to the first pixel (a) may be arrayed to be adjacent to each other. As described above, as the first SD 320-1 of the first pixel (a) and the second SD 320-2 of the second pixel (b) adjacent to the first pixel (a) are arrayed to be adjacent to each other, and thus, the inflow of the SLR caused by the light leakage due to the diffraction and diffused reflection of the incident light admitted into the PD 310-2 of the second pixel (b) adjacent to the first pixel (a) may be prevented and/or reduced.

Figure 10:
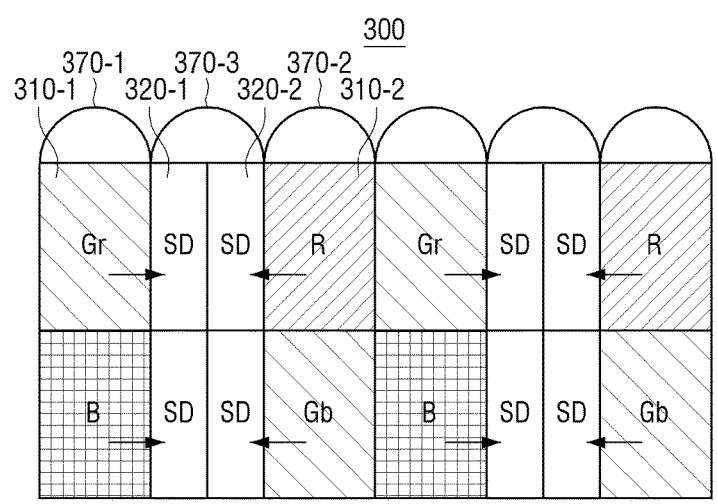
FIG. 10 is a diagram illustrating an example array of a micro lens for each of a plurality of pixels of an image sensor of a global shutter.

FIG. 10 is a diagram illustrating an example array of a micro lens for each of a plurality of pixels of an image sensor of a global shutter.

As described above, the SD 320 of each of the plurality of pixels of the image sensor 300 of the global shutter according to the example embodiment may be arrayed to be symmetrical to each other. Accordingly, the image sensor 300 of the global shutter according to the example embodiment may form the micro lens 370 in the area where the PD 310 of each of the plurality of pixels is arrayed and the area where the SD 320 of each of the plurality of pixels is adjacent to the SD 320 of other pixel.

For example, as illustrated in FIG. 10, from among the plurality of pixels of the image sensor 300 of the global shutter according to the example embodiment, a first micro lens 370-1 and a second micro lens 370-2 may be formed on the first PD 310-1 of the first pixel (a) and the second PD 310-2 in the second pixel (b) adjacent to the first pixel (a).

That is, the image sensor 300 according to the example embodiment forms the micro lens 370 in the area where the PD 310 of each of the plurality of pixels is arrayed.

The plurality of pixels of the image sensor 100 in the related art forms a micro lens 170 on each pixel including the PD 110 and the SD 120 as described above in connection with FIG. 3.

Accordingly, the PD 310 of each of the plurality of pixels of the image sensor 300 according to the example embodiment may enhance or improve the light collection efficiency as compared with the PD 110 of each of the plurality of pixels of the image sensor 100 in the related art.

In addition, each of the plurality of pixels of the image sensor 300 according to the example embodiment has the structure where the SD 320 of each pixel is arrayed to be symmetrical to each other, and thus, a manufacturing process for forming the micro lens 370 in the area where the PD 310 of each pixel is formed may be performed more easily as compared with the related art.

In addition, the manufacturing process for forming the shielding curtain 380 for preventing and/or reducing the charge occurrence due to the incident light admitted into the other area than the PD 310 of each of the plurality of pixels of the image sensor 300 may be performed more effectively as compared with the related art.

For example, the plurality of pixels of the image sensor 100 in the related art have the structure of being arrayed in the order of the PD 110 and the SD 120, and thus, a shielding curtain needs to be formed in an area where the SD 120 of each pixel is formed.

However, the plurality of pixels of the image sensor 300 according to the example embodiment have the structure where the SD 320 of each of the plurality of pixels is arrayed to be symmetrical to the SD 320 of other pixel, and thus, the shielding curtain 380 is formed in the area where the SD 320 of each of the plurality of pixels faces the SD 320 of another pixel.

As illustrated, the first SD 320-1 of the first pixel (a) and the second SD 320-2 of the second pixel (b) adjacent to the first pixel (a) among the plurality of pixels of the image sensor 300 of the global shutter according to the example embodiment may be arrayed to be symmetrical to each other. In this example, the shielding curtain 380 is formed in the area where the first SD 320-1 and the second SD 320-2 are formed, and thus, the manufacturing process for forming the shielding curtain 380 on the SD 320 of each pixel may be performed more effectively as compared with the related art.

Figure 11:
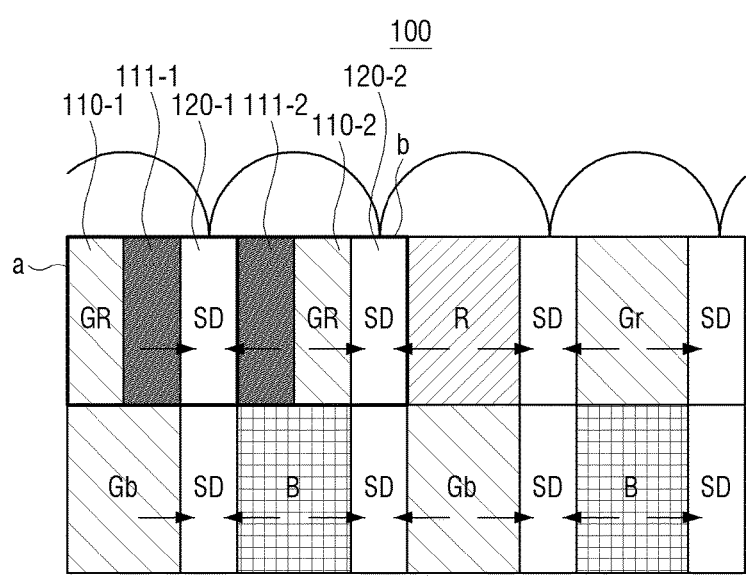
FIG. 11 is a diagram illustrating an example design structure for performing a phase difference auto focusing operation in an image sensor of a common global sensor.
Figure 12:
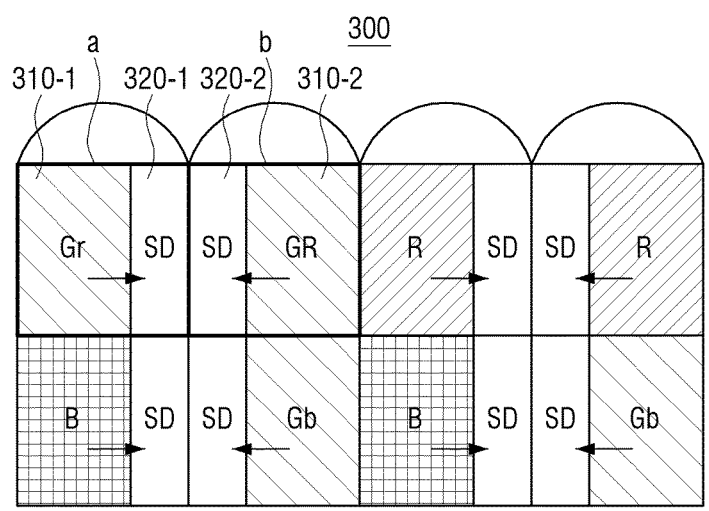
FIG. 12 is a diagram illustrating an example design structure for performing a phase difference auto focusing operation in an image sensor.

FIG. 11 is a diagram illustrating an example design structure for performing a phase difference auto focusing operation in an image sensor of a common global sensor, and FIG. 12 is a diagram illustrating an example design structure for performing a phase difference auto focusing operation in an image sensor.

The image sensor 100 of the global shutter in the related art performs the phase difference auto focusing operation through the design structure described below. For example, as illustrated in FIG. 11, a shielding curtain 111-1, 111-2 for the phase difference auto focusing operation is formed on the first pixel (a) and the second pixel (b) having the same color filter (Gr), among the plurality of pixels of the image sensor 100.

For example, the first shielding curtain 111-1 is formed between the first PD 110-1 and the first SD 120-1 of the first pixel (a), and the second shielding curtain 111-2 is formed between the second PD 110-2 and the second SD 120-1 of the second pixel (b) adjacent to the first pixel. Accordingly, the image sensor 100 compares the amount of charge accumulated in the first PD 110-1 of the first pixel (a) with the amount of charge accumulated in the second PD 110-2 of the second pixel (b), adjusts the amount of charge of the first PD 110-1 to be the same as the amount of charge of the second PD 110-2, and performs the phase difference auto focusing operation.

As described above, in order to perform the phase difference auto focusing operation in the image sensor 100 in the related art, the shielding curtain 111-1, 111-2 needs to be formed between the PD 110 and the SD 120 of each pixel.

Accordingly, the amount of charge which may be accumulated in the PD 110 of each pixel decreases, thereby causing performance deterioration problems in the low illuminance of the phase difference auto focusing operation.

In the image sensor 300 according to the example embodiment, a role of the shielding curtain for performing the conventional phase difference auto focusing operation is performed by the SD 320 of each pixel, and thus, a greater amount of charge may be accumulated in the PD 310 as compared with the related art.

For example, as illustrated in FIG. 12, the first SD 320-1 and the second SD 320-2 of the first pixel (a) and the second pixel (b) having the same color filter (Gr), among the plurality of pixels of the image sensor 300 according to the example embodiment are formed to be symmetrical and adjacent each other. In addition, as described above, the shielding curtain 380 for preventing the inflow of the charge into an area other than the first PD 310-1 and the second PD 310-22 of the first pixel (a) and the second pixel (b) may be formed in the area where the first SD 320-1 and the second SD 320-2 of the first pixel (a) and the second pixel (b) are formed.

Accordingly, the image sensor 300 according to the example embodiment compares the amount of charge accumulated in the first PD 310-1 of the first pixel (a) with the amount of charge accumulated in the second PD 310-2 of the second pixel (b), adjusts the amount of charge of the first PD 310-1 to be the same as the amount of charge of the second PD 310-2, and performs the phase difference auto focusing operation.

As described above, the SD 320 of each pixel of the image sensor 300 according to the example embodiment may be used as the shielding curtain for the phase difference auto focusing operation. Accordingly, a greater amount of charge may be accumulated in the PD 310 of each pixel of the image sensor 300 according to the example embodiment as compared with the related art, and thus, the performance deterioration problem in low illuminance according to the phase difference auto focusing operation may be improved.

Hereinafter, the detailed description on the image sensor 300 having the multi Photo Diode structure where the micro lens 370 is arrayed in the area the PD 310 of each of the plurality of pixels is adjacent to the PD of other pixel will be provided.

Figure 13:
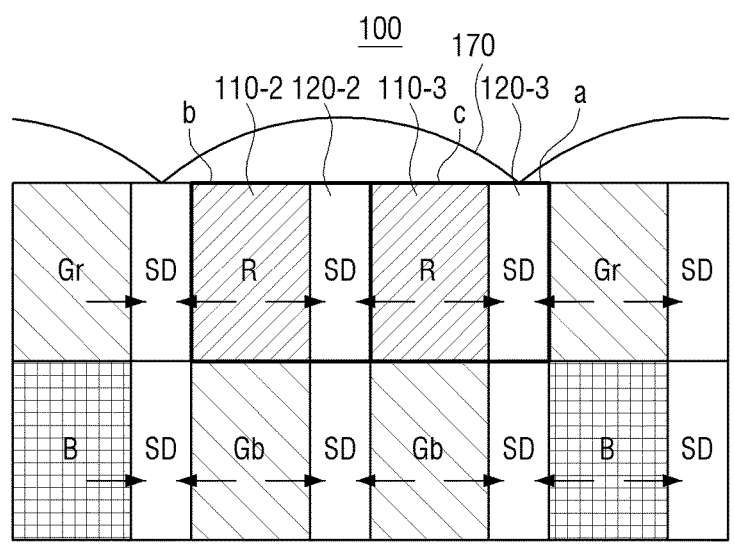
FIG. 13 is a diagram illustrating an image sensor in a common multi Photo Diode structure.
Figure 14:
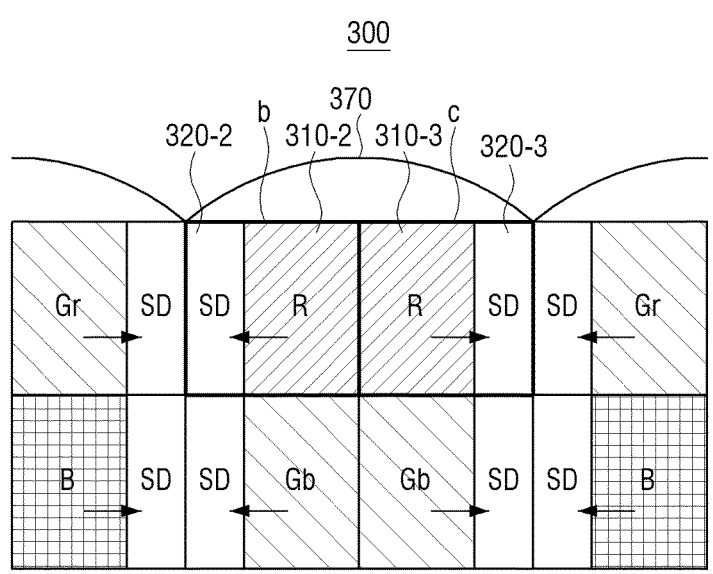
FIG. 14 is a diagram illustrating an example image sensor in a multi Photo Diode structure.

FIG. 13 is a diagram illustrating an image sensor in a common multi Photo Diode structure, and FIG. 14 is a diagram illustrating an example image sensor in a multi Photo Diode structure.

As illustrated in FIG. 13, the image sensor 100 having the multi Photo Diode structure in the related art forms the micro lens 170 on two pixels having the same color filter. For example, in the image sensor 100 in the related art, the micro lens 170 may be formed on the second pixel (b) and a third pixel (c) having the same color filter (R).

The micro lens 170 formed on the second pixel (b) and a third pixel (c) may be moved from the second PD 110-2 and a third PD 110-3 of the second pixel (b) and the third pixel (c) to another pixel adjacent to the second pixel (b) so as to accumulate the greater amount of charge. However, as the second PD 110-2 and the third PD 110-3 of the second pixel (b) and the third pixel (c) are arrayed in an exterior angle of the micro lens 170, the light collection efficiency of the incident light admitted through the micro lens 170 is deteriorated.

Meanwhile, in the image sensor 300 having another multi Photo Diode structure according to an example embodiment, the PD 310 of each of the plurality of pixels is arrayed in a center of the micro lens 370, and thus, the amount of the incident light admitted through the micro lens 370 may increase as compared with the image sensor 100 having the multi Photo Diode structure in the related art.

For example, as illustrated in FIG. 14, in the image sensor 300 having the multi Photo Diode structure according to an example embodiment, the SD 320 of each of the plurality of pixels may be symmetrical to the SD of other pixel. In this case, the second pixel (b) having the color filter (R) may be arrayed in the order of the second SD 320-2 and the second PD 310-2, and the third pixel (c) having the color filter (R) same as that of the second pixel (b) is formed may be arrayed in the order of the third PD 310-3 and the third SD 320-3. In addition, the micro lens 370 may be formed on the second and third pixels (b, c).

Accordingly, as the second PD 310-2 and the third PD 310-3 of the second and third pixels (b, c) are arrayed in the center of the micro lens 370, the amount of the incident light admitted through the micro lens 370 increases, and thus, the deterioration of the light collection efficiency of the image sensor 100 having the multi Photo Diode structure in the related art may be improved.

Figure 15A:
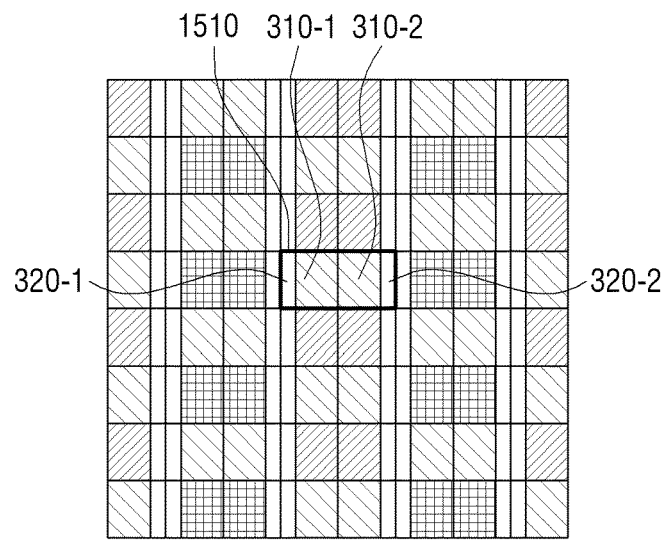
FIGS. 15A and 15B are diagrams illustrating various example multi Photo Diode structures of an image sensor.
Figure 15B:
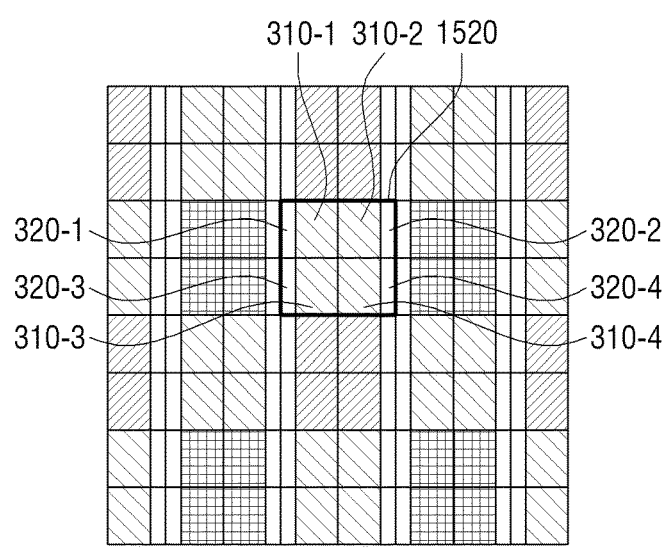

FIGS. 15A and 15B are diagrams illustrating various example multi Photo Diode structures of an image sensor.

As illustrated in FIG. 15A, the image sensor 300 of the global shutter according to the example embodiment may have the structure where the micro lens 370 is arrayed in the area where the PD 310 of each of at least two pixels among the plurality of pixels is adjacent to the PD of other pixel.

For example, in the image sensor 300 according to the example embodiment, the first PD 310-1 and the second PD 310-2 are arrayed to be adjacent to each other, and the micro lens 370 may be formed in an area 1510 where the first and second pixels having the same color filter are formed.

Accordingly, the first PD 310-1 and the second PD 310-2 of the first and second pixels may convert and accumulate the incident light admitted through the micro lens 370 into the charge.

As illustrated in FIG. 15B, the image sensor 300 of the global shutter according to the example embodiment may have the structure where the micro lens 370 is arrayed in the area in which the PD 310 of each of at least four pixels among the plurality of pixels is adjacent to the PD of other pixel.

For example, in the image sensor 300 according to the example embodiment, as the first to fourth PDs 310-1 to 310-4 are arrayed to be adjacent to each other, the micro lens 370 may be formed in an area 1520 where the first to fourth pixels having the same color filter are formed.

Accordingly, the first to fourth PDs 310-1 to 310-4 of the first and second pixels may convert and accumulate the incident light admitted through the micro lens 370 into the charge.

As described above, the image sensor 300 according to the example embodiment may accumulate the charge in the PD 310 of each pixel by using a few number of micro lens 370 and may have the multi Photo Diode structure having superior light collection efficiency to the multi Photo Diode structure of the image sensor 100 in the related art.

As above, a few example embodiments have been shown and described.

The foregoing example embodiments and advantages are merely exemplary and are not to be construed as limiting the disclosure. The disclosure can be readily applied to other types of devices. Also, the description of the example embodiments is intended to be illustrative, and not to limit the scope of the claims, and many alternatives, modifications, and variations will be apparent to those skilled in the art.

What is claimed is:

1. A photographing apparatus comprising:
an image sensor configured to include a plurality of pixels, each pixel comprising a Photo Diode and a Storage Diode, said Storage Diode configured to temporarily store a charge accumulated in the Photo Diode; and
an image processor configured to receive the charge stored in the Storage Diode of each of the plurality of pixels,
wherein the Storage Diodes of plural pixels are arranged to be adjacent to each other.

2. The apparatus as claimed in claim 1, wherein the a Storage Diode of each pixel in an odd column and a Storage Diode of each pixel in an even column among the plurality of pixels are arranged to be adjacent to each other.

3. The apparatus as claimed in claim 1, wherein a shading curtain is disposed in an area of the image sensor in which the Storage Diodes of the pixels are arranged adjacent to each other.

4. The apparatus as claimed in claim 1, wherein the image sensor further comprises a micro lens disposed over an area of the Photo Diode of each of the plurality of pixels, and disposed over an area in which the Storage Diodes of the plurality of pixels are arranged to be adjacent to each other.

5. The apparatus as claimed in claim 1, wherein the image sensor further comprises a micro lens disposed over an area in which the Photo Diode of each of the plurality of pixels is disposed.

6. The apparatus as claimed in claim 1, wherein the image further comprises a micro lens disposed over each of the plurality of pixels.

7. The apparatus as claimed in claim 6, wherein a Storage Diode of a first pixel and a Storage Diode of a second pixel among the plurality of pixels are adjacent to each other, and a shading curtain is formed in an area in which the Storage Diode of the first pixel and the Storage Diode of the second pixel are adjacent,
wherein the image sensor is configured to perform a phase difference auto focusing operation based on an amount of charge respectively accumulated in the Photo Diodes of the first pixel and the second pixel having Storage Diodes adjacent to each other.

8. The apparatus as claimed in claim 1, wherein the image sensor comprises a multi Photo Diode structure wherein a micro lens is disposed over an area in which Photo Diodes of at least two pixels among the plurality of pixels are adjacent to each other.

9. The apparatus as claimed in claim 1, wherein the image sensor comprises a multi Photo Diode structure wherein a micro lens is disposed over an area in which Photo Diodes of at least four pixels among the plurality of pixels are adjacent to each other.

10. The apparatus as claimed in claim 1, further comprising:
a controller configured to control the image sensor to read out the charge stored in each of the plurality of pixels, wherein each of the plurality of pixels further comprises:
a Floating Diffusion configured to read out the charge stored in the Storage Diode based on a control command of the controller;
a first switch configured to perform a switching operation to temporarily store the charge accumulated in the Photo Diode into the Storage Diode; and
a second switch configured to perform a switching operation to read out the charge temporarily stored in the Storage Diode by the Floating Diffusion.

11. An image sensor comprising a plurality of pixels, each pixel including a Photo Diode and a Storage Diode, the image sensor comprising:
a structure wherein Storage Diodes of two adjacent pixels among the plurality of pixels are arranged to be adjacent to each other.

12. The image sensor as claimed in claim 11, wherein pixels in an odd column among the plurality of pixels are arranged in an order of a Photo Diode and a Storage Diode, and pixels in an even column among the plurality of pixels are arranged in an order of a Storage Diode and a Photo Diode.

13. The image sensor as claimed in claim 11, wherein each of the plurality of pixels comprises a shading curtain disposed in an area in which the Storage Diode of each of the plurality of pixels is arranged to be adjacent to another Storage Diode.

14. The image sensor as claimed in claim 11, wherein each of the plurality of pixels comprises a micro lens disposed over an area in which the Photo Diode of each of the plurality of pixels is arranged and over an area in which the Storage Diodes of the plurality of pixels are adjacent to each other.

15. The image sensor as claimed in claim 11, wherein each of the plurality of pixels includes a micro lens is disposed over an area in which the Photo Diode of each of the plurality of pixels is disposed.

16. The image sensor as claimed in claim 11, wherein each of the plurality of pixels comprises a micro lens disposed over an area in which the plurality of pixels is formed.

17. The image sensor as claimed in claim 16, wherein a first pixel and a second pixel adjacent to each other include a shading curtain formed in an area in which a Storage Diode of the first pixel and a Storage Diode of the second pixel are adjacent each other,
wherein the image sensor is configured to perform a phase difference auto focusing operation based on an amount of charge respectively accumulated in the Photo Diodes of the first pixel and the second pixel having Storage Diodes adjacent to each other among the plurality of pixels.

18. The image sensor as claimed in claim 11, wherein each of the plurality of pixels comprises a micro lens disposed over an area in which Photo Diodes of at least two pixels among the plurality of pixels are adjacent to each other.

19. The image sensor as claimed in claim 11, wherein each of the plurality of pixels comprises a micro lens disposed over an area in which Photo Diodes of at least four pixels among the plurality of pixels are adjacent to each other.

* * * * *